(12) United States Patent
Carlson

(10) Patent No.: US 10,156,402 B1
(45) Date of Patent: Dec. 18, 2018

(54) SYSTEMS AND METHODS FOR SPRAY COOLING

(71) Applicant: National Technology & Engineering Solutions of Sandia, LLC, Albuquerque, NM (US)

(72) Inventor: Matthew David Carlson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 93 days.

(21) Appl. No.: 15/291,698

(22) Filed: Oct. 12, 2016

Related U.S. Application Data

(60) Provisional application No. 62/240,100, filed on Oct. 12, 2015.

(51) Int. Cl.
- *F28D 15/02* (2006.01)
- *F28D 15/04* (2006.01)
- *F28F 13/08* (2006.01)

(52) U.S. Cl.
CPC ............. *F28D 15/02* (2013.01); *F28D 15/04* (2013.01); *F28D 15/046* (2013.01); *F28F 13/08* (2013.01); *F28F 2250/08* (2013.01)

(58) Field of Classification Search
CPC ........ F28D 15/02; F28D 15/04; F28D 15/046; F28D 15/025; F28D 2015/0291; F28D 15/0266; F28D 20/0034; F28F 13/08; F28F 2250/08; F25B 21/02; F25B 21/04; F25B 2321/02; F25B 2321/021; F25B 2321/0211; F25B 2321/0212; F25B 2321/023; F25B 2321/025; F25B 2321/0251; F25B 21/06; F25B 1/08; F25B 2341/00; F25B 2341/001; F25B 2341/0012; F25B 2341/0013; F25B 2341/0014; F25B 2341/0015; F25B 2341/0016; F25B 2400/04073; H01L 23/38; B60H 2001/3298
USPC ............ 165/104.25, 104.26, 104.19, 104.21, 165/104.22, 104.24; 62/3.2, 3.7, 116, 500
See application file for complete search history.

(56) References Cited

U.S. PATENT DOCUMENTS

| | | | | |
|---|---|---|---|---|
| 2,122,053 | A * | 6/1938 | Burkhardt | B22F 3/1121 210/510.1 |
| 3,277,660 | A * | 10/1966 | Kemper | F25B 1/06 62/116 |
| 3,661,202 | A * | 5/1972 | Moore, Jr. | F28D 15/06 126/350.2 |
| 8,307,885 | B2 * | 11/2012 | Kim | F25B 9/04 165/104.22 |
| 8,763,408 | B2 * | 7/2014 | Ma | F28D 15/043 165/104.26 |
| 2006/0266072 | A1 * | 11/2006 | Takeuchi | F25B 40/00 62/500 |

* cited by examiner

Primary Examiner — Justin Jonaitis
(74) Attorney, Agent, or Firm — Daniel J. Jenkins

(57) ABSTRACT

The present disclosure is directed to systems, devices and methods for cooling a surface with a plurality of ejectors. The fluid provided to the micro-ejectors includes vapor formed at the surface. The vapor provides the driving force for driving fluid through the micro-ejectors.

11 Claims, 2 Drawing Sheets

SYSTEMS AND METHODS FOR SPRAY COOLING

CROSS-REFERENCE TO RELATED APPLICATIONS

This application claims priority to U.S. Provisional Patent Application Ser. No. 62/240,100, entitled "SYSTEMS AND METHODS FOR SPRAY COOLING," by Matthew Carlson, filed Oct. 12, 2015, the disclosure of which is incorporated herein by reference in its entirety.

STATEMENT CONCERNING FEDERALLY-SPONSORED RESEARCH

This invention was developed under Contract DE-AC04-94AL85000 between Sandia Corporation and the United States Department of Energy. The U.S. Government has certain rights in this invention.

FIELD OF THE INVENTION

The present invention is directed towards cooling, and more particularly directed to spay cooling systems and methods that use the heat removed from an object to be cooled to drive cooling fluid flow.

BACKGROUND OF THE INVENTION

Current spray-cooling equipment uses an arrangement of spray-cooling nozzles to direct a coolant at a heated surface to provide cooling for extreme heat fluxes (above 100 W/cm$^2$). These nozzles are supplied by external fluid conditioning and pumping equipment that require external power and increase both the size and complexity of the system.

Heat pipes are currently used for cooling. In a heat pipe, a two-phase fluid is hermetically-contained in a tube with wicking material at the wall. Liquid-phase fluid contained in the wick is vaporized in the hot end of the heat pipe, travels into a vapor chamber connecting the hot and cold ends of the pipe, condenses on the wick at the cold end of the pipe, and travels through the wick to the hot end of the pipe. In a heat pipe, the motive force for the fluid is provided by the effects of differential surface tension at either end of the wick.

What are needed are systems and methods for using spray cooling devices that overcome the limitations of the prior art.

BRIEF DESCRIPTION OF THE DRAWINGS

Wherever possible, the same reference numbers will be used throughout the drawings to represent the same parts.

SUMMARY

Figure 1:
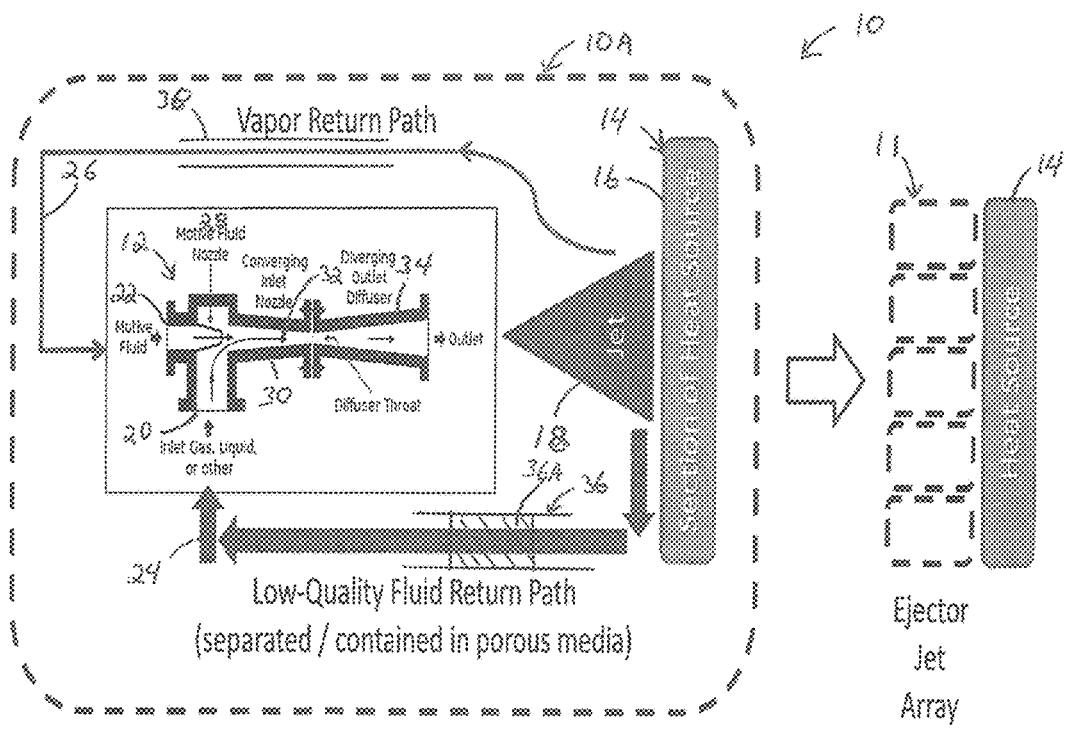
FIG. 1 is a schematic drawing of a cooling system according to an embodiment of the disclosure.

According to the present disclosure, systems and methods are disclosed that use one or more micro-ejectors (ejectors) to form self-powered sprays or jets of a cooling fluid. The jets of cooling fluid are directed onto a high temperature surface that vaporizes a portion of the cooling fluid. The vaporized cooling fluid is used by the ejectors to drive the cooling fluid through the ejector to create the jet of cooling fluid.

The disclosed ejectors are solid-state devices that use high-energy fluid in the form of vapor to entrain and drive a lower-energy liquid fluid through an in-line converging-diverging nozzle. The high-energy vapor is created from heat received from a high-heat flux, high temperature surface to be cooled. The ejectors are a non-moving form of a turbo-compressor that is directly driven by fluid vaporizing off of the heated surface. The vapor provides flow to the spray nozzle, supplanting external equipment and reducing the size and complexity of the cooling system while also improving reliability.

In an embodiment, a device is disclosed that includes a housing and a plurality of ejectors disposed in the housing. The ejectors include a first inlet for providing a first fluid to a converging inlet nozzle, a second inlet for providing a second fluid to a motive fluid nozzle, wherein the motive fluid nozzle directs the second fluid nozzle into the converging inlet nozzle to entrain the first liquid and form a fluid mixture, and a diverging outlet diffuser that receives the fluid mixture from the converging inlet nozzle and forms a fluid jet that is directed into a fluid heating zone. A first conduit is disposed within the housing between the fluid heating zone and the first inlet, and a second conduit disposed within the housing between the fluid heating zone and the second inlet.

In another embodiment, a system is disclosed that includes a component having a heated surface and a device. The device includes a housing and a plurality of ejectors disposed within the housing. The ejectors include a first inlet for providing a first fluid to a converging inlet nozzle, a second inlet for providing a second fluid to a motive fluid nozzle, wherein the motive fluid nozzle directs the second fluid nozzle into the converging inlet nozzle to entrain the first liquid and form a fluid mixture, and a diverging outlet diffuser that receives the fluid mixture from the converging inlet nozzle and forms a fluid jet that is directed into a fluid heating zone, the fluid heating zone defined between the plurality of ejectors and the heated surface. A first conduit is disposed within the housing between the fluid heating zone and the first inlet, and a second conduit is disposed within the housing between the fluid heating zone and the second inlet.

In another embodiment, a method is disclosed that includes separating a fluid heated at a heated surface into a vaporized fluid stream and a liquid stream, injecting the vaporized fluid stream into the liquid stream in a converging inlet nozzle to form a two phase fluid stream, forming a fluid jet in a diverging outlet diffuser, and directing the jet of fluid onto the heated surface.

DETAILED DESCRIPTION

The present disclosure is directed to systems that include one or more solid-state micro-ejectors (ejectors) to form jets of cooling fluid to cool a high heat flux, high temperature surface. The ejectors are self-powered, meaning that the energy removed from the high temperature surface in the form of heat is used to drive the fluid flow through the ejectors. The ejectors include an injection nozzle that receives high-energy vapor created at the high temperature surface to entrain and drive a lower-energy fluid through an in-line converging-diverging nozzle within the ejectors, effectively acting as a solid-state turbo-compressor or turbopump. The ejectors are arranged adjacent the heated surface to provide direct spray cooling of the cooling fluid onto the heated surface.

The present disclosure is further directed to cooling methods that include producing vapor at a high temperature surface that is routed to an injection nozzle in an ejector, while liquid at the high temperature surface is routed to the ejector. At the ejector, the vapor is injected into the liquid by an injector entrain the liquid and form a two phase fluid (liquid and vapor) that is directed into a converging-diverging nozzle to form a two phase cooling fluid jet. The two phase cooling fluid jet is directed upon the high temperature surface to complete the cycle. The liquid at the high temperature surface is formed by liquid in the two phase cooling fluid jet as well as condensed vapor.

The disclosed systems and methods are self-powered, driven at start-up by vaporization of coolant adjacent to the heated plate, and could automatically adjust the flow rate of the fluid and spray velocity with increased heat input at the plate without the complexity of an sensing and control equipment. The simplified routing of the fluids reduces their inventory, thermal mass, and the size of the overall system allowing for fast start-up and load following performance limited only by the connection with an ultimate heat sink. The system is easily scaled to the given heat load by putting multiple independent units in parallel. This parallelism, the lack of any maintenance-heavy rotating equipment, and the hermetic sealing possible with this system provide incredible reliability and robustness.

The ejectors are arranged adjacent a heated surface to provide direct spray cooling of a coolant upon the heated surface. The fluid flow of the coolant is provided by the motive power of vapor produced at the heated surface. The ejectors include injection nozzles that receive a vapor fraction of a two-phase coolant produced by a transfer of heat from the heated surface. The heated surface may be, but is not limited to a heated plate. The heat transferred into the impinging coolant vaporizes part of the coolant, which is returned to the ejector to be injected into a liquid portion of the coolant also returned from the heated surface to the injector. The jet of coolant can be all liquid or a combination of liquid and vapor, or in other words, a two phase coolant. Some or all of the liquid portion may result from coolant that has condensed at the heated surface. In such a manner, the ejectors are self-powered FIG. 1 is a schematic diagram of a cooling system 10 according to an embodiment of the disclosure. As can be seen in FIG. 1, the cooling system 10 includes a plurality of ejectors 11 and a heated component (component) 14. The plurality of ejectors 11 are adjacent to or in proximity to the component 14. FIG. 1 also includes a detailed portion 10A that shows an ejector 12 and the component 14 to be cooled by the ejector 12. The component 14 includes a high-heat flux, high temperature surface (surface) 16 to be cooled by a cooling fluid 13. The component 14 is a may be a stand-alone device or part of a larger device that generates or receives heat from another component (not shown). The component 14 may be, but is not limited to a high powered electronic, a fusion first-wall, a concentrated solar power (CSP) receiver, a nuclear fuel rod or component, a leading edges of hypersonic vehicle flight surface, an integrated circuit, a solid-state switching electronic, a laser diodes or other component that requires or may require cooling to optimally perform.

The ejector 12 forms a cooling fluid jet 18 that is directed upon the surface 16. The surface 16 is at a temperature greater than the vaporization temperature of the cooling fluid during steady state operation of the cooling system 10.

The ejector 12 includes a first inlet 20 and a second inlet 22. The first inlet 20 receives a first fluid stream 24. The second inlet 22 receives a second fluid stream 26. The ejector 12 further includes a fluid nozzle 28 in fluid connectivity with the second inlet 22. The ejector 12 further includes a converging inlet nozzle 30. The fluid nozzle 28 is arranged to direct the second fluid stream 24 from the second inlet into the converging inlet nozzle 30 while entraining the first fluid stream 24 from the first inlet 20 to form a combined fluid stream. In such a manner, the second fluid stream 26 provides a motive force or energy to power the combined fluid stream 32. The ejector 12 further includes a diverging outlet diffuser 34 that receives the combined fluid 32 from the converging inlet nozzle 30 and forms the cooling fluid spray or jet 18. In this exemplary embodiment, the diverging outlet nozzle is shown as an attached component to the other remaining component of the ejector 12. In other embodiments, the ejector may be a unitary body or formed of two or more fastened or joined bodies or components.

The system also includes a first conduit 36 for transporting a first fluid of the first fluid stream 26 from the surface 16 to the first inlet 20. The first conduit 36 may include a wicking material may 36A to improve separation between liquid and vapor phases and to increase tolerance of the system to external acceleration effects. The wicking material can be a porous metal, ceramic or cermet material capable of wicking a liquid.

The system 10 also includes a second conduit 38 for transporting a second fluid of the second fluid stream 26 from the surface 16 to the second inlet 22. The second conduit 38 may be referred to as a vapor transport conduit or tube. In an embodiment, the second conduit may include separation surfaces to separate or enhance separation of vapor and liquid so that only vapor passes through while liquid droplets condense back down to the plate In another embodiment the second conduit 38 may be provided with torturous surfaces to separate the vapor and liquid so that only vapor passes through while liquid droplets condense back down to the plate. In this exemplary embodiment, the second conduit 38 is shown as a straight conduit, in other embodiments, the second conduit may include straight and bent portions and/or may forma a tortuous pathway.

The cooling system 10 operates by producing vapor at the high temperature surface 12 and routing the vapor through the second conduit to the second inlet 22 while at the same time routing or returning liquid from the surface 12 through the first conduit 36 to the first inlet 20. At the ejector 12, the vapor is injected into the liquid by the fluid nozzle 28 to entrain the liquid and form a two phase fluid (liquid and vapor) that is formed into a two phase cooling fluid jet by the diverging outlet diffuser 34. The two phase cooling fluid jet is directed upon the high temperature surface 12 to complete the cycle.

Figure 2:
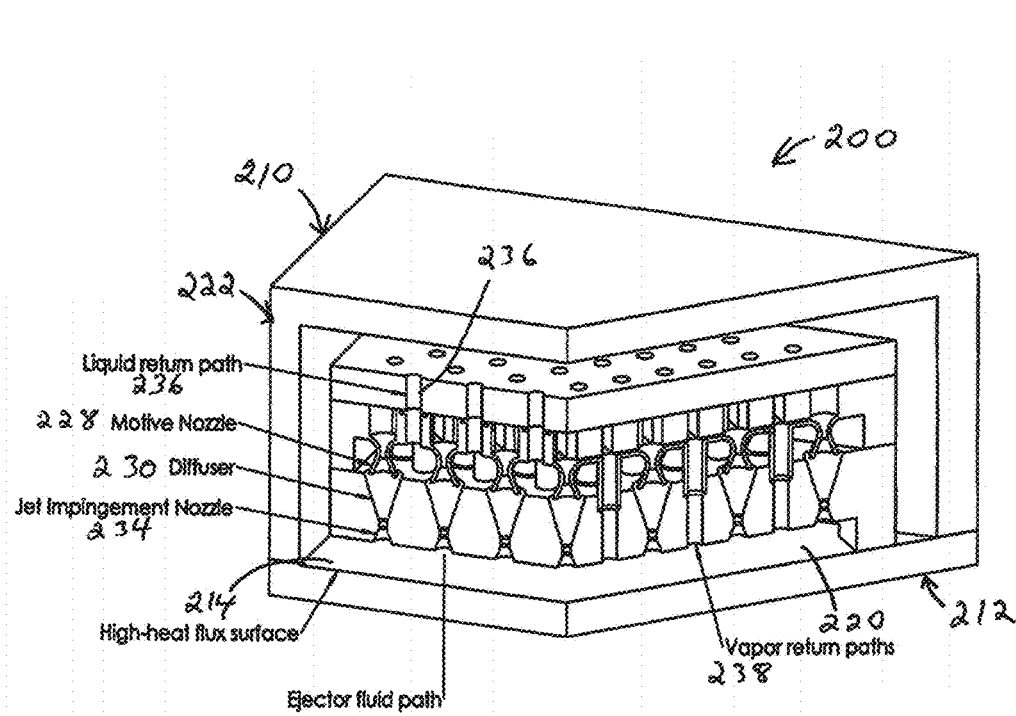
FIG. 2 is an illustration of a cooling system according to an embodiment of the disclosure.
Figure 3:
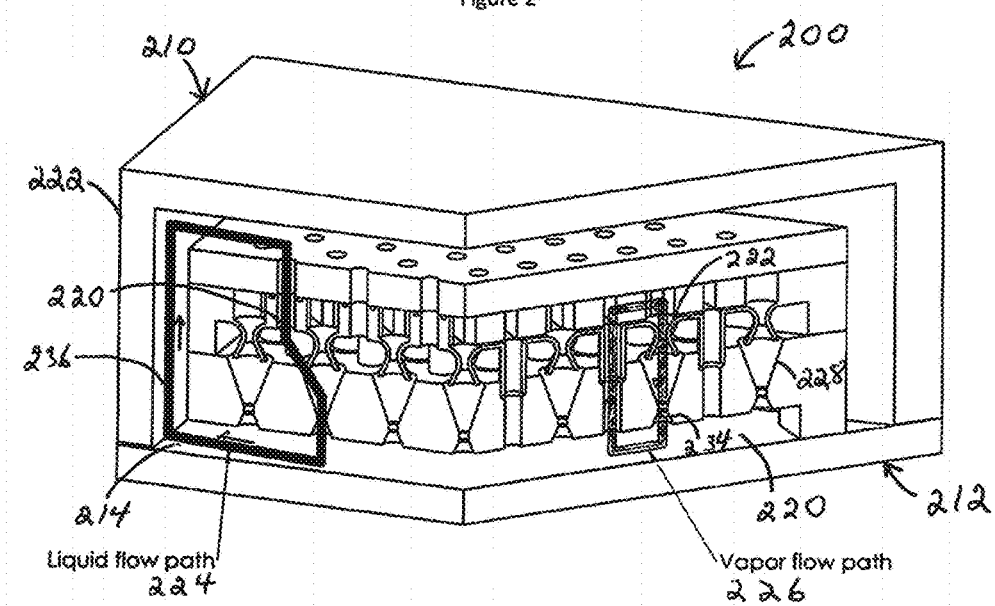
FIG. 3 shows the liquid and vapor flow paths in the cooling system of FIG. 2.

FIGS. 2 and 3 illustrate a more detailed drawing of a cooling system 200 according to an embodiment of the disclosure. The cooling system 200 includes a cooling module or device 210 and a heated component (component) 212. The component 212 includes a high temperature, high-heat flux surface (surface) 214.

The cooling device 210 includes a plurality of ejectors 216 arranged or disposed within a cooling housing 218. The cooling housing 218 includes cooling surfaces 222. The cooling surfaces 222 may be air or liquid cooled. In this exemplary embodiment, the cooling surfaces 222 are shown as flat surfaces, however, in other embodiments, the cooling surfaces 222 may not be flat, but may be include ridges, undulations, fins or other irregular surfaces that enhance heat transfer away from the cooling housing 218. A fluid heating zone is located or disposed between the plurality of ejectors 216 and the surface 214.

Each ejector 216A of the plurality of ejectors 216 includes a motive fluid nozzle or fluid nozzle 228, a diffuser or converging inlet nozzle 230, and a jet impingement nozzle or diverging outlet diffuser 234. The functions of these components are as discussed above regarding the embodiment of FIG. 1.

The cooling device 210 further includes a plurality of liquid return paths or first conduits 236 and a plurality of vapor return paths or second conduits 238. As discussed above regarding the embodiment of FIG. 1, in other embodiments the first conduits may include a wicking material and the second conduits may include tortuous surfaces or pathways. In other embodiments, the first conduits may be formed or defined by or partially formed or defined by the cooling housing. In those embodiments the wicking material may be provided on the cooling housing surfaces to provide for vapor condensation and movement of liquid toward the ejectors 216.

FIG. 3 shows the liquid flow path or direction of the first flow stream 224 and the vapor flow path or direction of the second fluid stream 226. In an embodiment, much of the liquid flow path may be filled with the wicking material discussed above to avoid mixing or the influence of gravity. The wicking material may also assist in lowering the pressure of the liquid plenum region to allow start-up of the motive nozzle jets.

In operation, the system 200 is filled with a refrigerant or other two-phase fluid. Vapor generated from heating of this fluid by heat transferred from the surface 214 returns through the second conduit 238 to the ejector second inlet 222. At the same time, liquid refrigerant from the fluid heating zone 220 enters the first conduit 236 and flows to the ejector first inlet 220. The pressure of the vapor will be slightly higher than that of the liquid, forcing vapor through the converging inlet nozzle 228 and into the diverging outlet diffuser 234. This flow entrains liquid supplied from the first conduit 224, increasing in velocity as it decreases in pressure. The two phase mixture then passes out through the jet impingement nozzles, recovering some pressure and further increasing in velocity to create an array of jets focused on the surface 214. In such a manner, the device 210 removes heat from the surface 214 and dissipates that heat from the cooling surfaces 222.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A device for cooling a heat source, comprising:
    a housing;
    a plurality of ejectors disposed within the housing wherein an ejector of the plurality of ejectors comprises:
        a first inlet for providing a first fluid to a converging inlet nozzle; and
        a second inlet for providing a second fluid to a motive fluid nozzle, wherein the motive fluid nozzle directs the second fluid nozzle into the converging inlet nozzle to entrain the first fluid and form a fluid mixture;
    a diverging outlet diffuser that receives the fluid mixture from the converging inlet nozzle and forms a fluid jet that is directed toward a heated surface and into a fluid heating zone adjacent to and in thermal communication with the heat source; a first conduit disposed within the housing between the fluid heating zone and the first inlet; and a second conduit disposed within the housing between the fluid heating zone and the second inlet.

2. The device of claim 1, further comprising a wicking material disposed in the first conduit.

3. The device of claim 2, wherein the wicking material is selected from a group consisting of porous ceramics, porous metals and porous cermets.

4. A system, comprising:
    a component comprising a heated surface; and
    a device comprising:
        a housing;
        a plurality of ejectors disposed within the housing wherein an ejector of the plurality of ejectors comprises:
            a first inlet for providing a first fluid to a converging inlet nozzle;
            a second inlet for providing a second fluid to a motive fluid nozzle, wherein the motive fluid nozzle directs the second fluid nozzle into the converging inlet nozzle to entrain the first fluid and form a fluid mixture;
            a diverging outlet diffuser that receives the fluid mixture from the converging inlet nozzle and forms a fluid jet that is directed toward the heated surface and into a fluid heating zone adjacent to and in thermal communication with the heated surface, the fluid heating zone defined between the plurality of ejectors and the heated surface;
            a first conduit disposed within the housing between the fluid heating zone and the first inlet; and
            a second conduit disposed within the housing between the fluid heating zone and the second inlet.

5. The system of claim 4, further comprising:
    a wicking material disposed in the first conduit.

6. The system of claim 5, wherein the wicking material is selected from a group consisting of porous ceramics, porous metals and porous cermets.

7. A method for cooling a heated surface of a component, comprising
    separating a fluid heated at a heated surface into a vaporized fluid stream and a liquid stream;
    injecting the vaporized fluid stream into the liquid stream in a converging inlet nozzle to form a two phase fluid stream;
    forming a fluid jet in a diverging outlet diffuser; and
    directing the jet of fluid directly toward the heated surface.

8. The method of claim 7, wherein the vaporized fluid stream provides a motive force for driving the fluid jet.

9. The method of claim 7, wherein the liquid stream is transported by a wicking material.

10. The method of claim 7, further comprising:
    removing heat from the liquid stream.

11. The method of claim 7, wherein the fluid is a refrigerant.

* * * * *